(12) United States Patent
Aigner

(10) Patent No.: US 11,146,235 B1
(45) Date of Patent: Oct. 12, 2021

(54) TUNABLE BAW RESONATOR WITH ION-CONDUCTIBLE STRUCTURE

(71) Applicant: Qorvo US, Inc., Greensboro, NC (US)

(72) Inventor: Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/875,242

(22) Filed: May 15, 2020

(51) Int. Cl.
*H03H 9/13* (2006.01)
*H03H 9/02* (2006.01)

(52) U.S. Cl.
CPC .......... *H03H 9/131* (2013.01); *H03H 9/0211* (2013.01); *H03H 9/02015* (2013.01); *H03H 9/02157* (2013.01); *H03H 2009/02188* (2013.01)

(58) Field of Classification Search
CPC .. H03H 9/02015; H03H 9/131; H03H 9/0211; H03H 9/02157; H03H 2009/02188
USPC ................. 333/133, 187, 188, 189
See application file for complete search history.

(56) References Cited

U.S. PATENT DOCUMENTS

| | | | |
|---|---|---|---|
| 5,587,620 A | 12/1996 | Ruby et al. | |
| 6,534,900 B2 | 3/2003 | Aigner et al. | |
| 6,653,913 B2 | 11/2003 | Klee et al. | |
| 10,205,436 B2 | 2/2019 | Scott et al. | |
| 2006/0001329 A1* | 1/2006 | Rao | H03H 9/02102 310/315 |
| 2007/0210879 A1* | 9/2007 | Cardona | H03H 9/172 333/188 |

OTHER PUBLICATIONS

Berge, J., et. al., "Tunable bulk acoustic wave resonators based onBa0.25Sr0.75TiO3 thin films and a HfO2/SiO2 Bragg reflector," IEEE Trans.Ultrason. Ferroelectr. Freq. Control, vol. 58, No. 12, Dec. 2011, pp. 2768-2771.
El Hassan, M., et al., "Techniques for Tuning BAW-SMR Resonators for the 4th Generation of Mobile Communications," www.intechopen.com, 2013, pp. 421-442.
Volatier, A., et al., "Switchable and tunable strontium titanate electrostrictive bulk acoustic wave resonator integrated with a Bragg mirror", Appl. Phys. Lett., vol. 92(3), 032906, 2008, 3 pages.

* cited by examiner

*Primary Examiner* — Rakesh B Patel
*Assistant Examiner* — Jorge L Salazar, Jr.
(74) *Attorney, Agent, or Firm* — Withrow & Terranova, PLLC

(57) ABSTRACT

The present disclosure relates to a tunable Bulk Acoustic Wave (BAW) resonator with a top electrode, a bottom electrode, a piezoelectric layer sandwiched between the top electrode and the bottom electrode, and a reflection region underneath the bottom electrode. The reflection region includes a reflection layer and an ion-conductible structure between the bottom electrode and the reflection layer. Herein, the ion-conductible structure has a first terminal layer coupled to the bottom electrode, a second terminal layer coupled to the reflection layer, and an ion conductor between the first terminal layer and the second terminal layer. The ion conductor is eligible to transport ions between the first terminal layer and the second terminal layer, so as to achieve a mass-loading shift between the first terminal layer and the second terminal layer, and consequently, to tune a resonance frequency of the tunable BAW resonator.

17 Claims, 3 Drawing Sheets

TUNABLE BAW RESONATOR WITH ION-CONDUCTIBLE STRUCTURE

FIELD OF THE DISCLOSURE

The present disclosure relates to a Bulk Acoustic Wave (BAW) resonator, and more particularly to a tunable BAW resonator with ion-conductible structure.

BACKGROUND

Due to their high Q values, and low insertion losses at microwave frequencies, particularly those above 1.5 Gigahertz (GHz), Bulk Acoustic Wave (BAW) resonators have been widely used in Radio Frequency (RF) applications. For instance, BAW filters, which are formed by the BAW resonators, are the filter of choice for many $3^{rd}$ Generation (3G) and $4^{th}$ Generation (4G) wireless devices, and are destined to dominate filter applications for $5^{th}$ Generation (5G) wireless devices.

In addition, the BAW filters that are adaptable to variable frequency ranges will be superiorly attractive in wide band applications bracketing many different spectrums used in different regions worldwide; attractive in mobile phones to improve co-existence between multiple wireless standards; attractive in military communication systems to reduce vulnerability to jamming; and attractive in timing applications to create low phase-noise oscillators. However, current implementations of the BAW filters with variable frequency ranges may be based on non-linear materials, may increase the size and cost of the devices significantly, may consume a large amount of power, and/or may cause high insertion losses. Accordingly, there is a present need to achieve tunable frequency ranges for the BAW devices without sacrificing linearity behavior, power consumption, insertion losses, and/or device cost and size.

SUMMARY

The present disclosure relates to a tunable Bulk Acoustic Wave (BAW) resonator with a top electrode, a bottom electrode, a piezoelectric layer sandwiched between the top electrode and the bottom electrode, and a reflection region underneath the bottom electrode. The reflection region includes a reflection layer and an ion-conductible structure between the bottom electrode and the reflection layer. Herein, the ion-conductible structure has a first terminal layer coupled to the bottom electrode, a second terminal layer coupled to the reflection layer, and an ion conductor between the first terminal layer and the second terminal layer. The ion conductor is eligible to transport ions between the first terminal layer and the second terminal layer, so as to achieve mass-loading shift between the first terminal layer and the second terminal layer, and consequently, to tune resonance frequency of the tunable BAW resonator. The reflection layer has a greater density than the ion conductor, and at least one of the first terminal layer and the second terminal layer has a greater density than the ion conductor.

In one embodiment of the tunable BAW resonator, the ions are transported through the ion conductor between the first terminal layer and the second terminal layer by applying an electric current from an outside power supply.

In one embodiment of the tunable BAW resonator, the direction of the electric current determines if the ions accumulate at the first terminal layer or accumulate at the second terminal layer.

In one embodiment of the tunable BAW resonator, the first terminal layer has greater frequency sensitivity than the second terminal layer, such that the first terminal has a greater frequency effect on the resonance frequency of the tunable BAW resonator than the second terminal with a same thickness change.

In one embodiment of the tunable BAW resonator, the density of the reflection layer is 5 or more times greater than a density of the ion conductor.

In one embodiment of the tunable BAW resonator, a density of at least one of the first terminal layer and the second terminal layer is 5 or more times greater than the density of the ion conductor.

In one embodiment of the tunable BAW resonator, the reflection region includes alternating high acoustic impedance layers and low acoustic impedance layers. Herein, the high acoustic impedance layers have higher acoustic impedance, higher density, and higher stiffness than the low acoustic impedance layers. The reflection layer is one of the high acoustic impedance layers, and resides at a top of the alternating high acoustic impedance layers and low acoustic impedance layers.

In one embodiment of the tunable BAW resonator, each of the high acoustic impedance layers is formed of tungsten, and each of the low acoustic impedance layers is formed of silicon dioxide ($SiO_2$).

In one embodiment of the tunable BAW resonator, a thickness of the first terminal layer is less than 5% of an acoustic wavelength in piezoelectric layer, and a thickness of the second terminal layer is less than 5% of the acoustic wavelength in the piezoelectric layer.

In one embodiment of the tunable BAW resonator, the first terminal layer is a cathode, which is an ion source. The second terminal layer is an anode, which is configured to store or release the ions.

In one embodiment of the tunable BAW resonator, the ions are transported through the ion conductor between the first terminal layer and the second terminal layer by applying an electric current from an outside power supply. During a charging process, the ions are transported from the first terminal layer to accumulate at the second terminal layer, so as to increase the resonance frequency of the tunable BAW resonator. During a discharging process, the ions are released from the second terminal layer back to the first terminal layer, so as to decrease the resonance frequency of the tunable BAW resonator.

In one embodiment of the tunable BAW resonator, the first terminal layer is 5 or more times greater than the density of the ion conductor.

In one embodiment of the tunable BAW resonator, the ion conductor is formed of one or more of lithium phosphorus oxynitride (LiPON), lithium lanthanum zinc oxide (LLZO), and lithium lanthanum titanium oxide (LLTO). The first terminal layer is formed of one or more of lithium cobalt oxide ($LiCoO_2$), lithium ion manganese oxide ($LiMn_2O_4$), and vanadium pentoxid ($V_2O_5$). The second terminal layer is formed of lithium or carbon.

In one embodiment of the tunable BAW resonator, the second terminal layer is a cathode, which is an ion source. The first terminal layer is an anode, which is configured to store or release the ions.

In one embodiment of the tunable BAW resonator, the ion conductor is formed of silver-Iodide (AgI).

In one embodiment of the tunable BAW resonator, the top electrode and the bottom electrode are formed of one of tungsten (W), molybdenum (Mo), and platinum (Pt). The piezoelectric layer is formed of aluminum nitride (AlN) or zinc oxide (ZnO).

According to another embodiment, the tunable BAW resonator further includes a substrate formed of silicon (Si). The reflection region is coupled between the bottom electrode and the substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
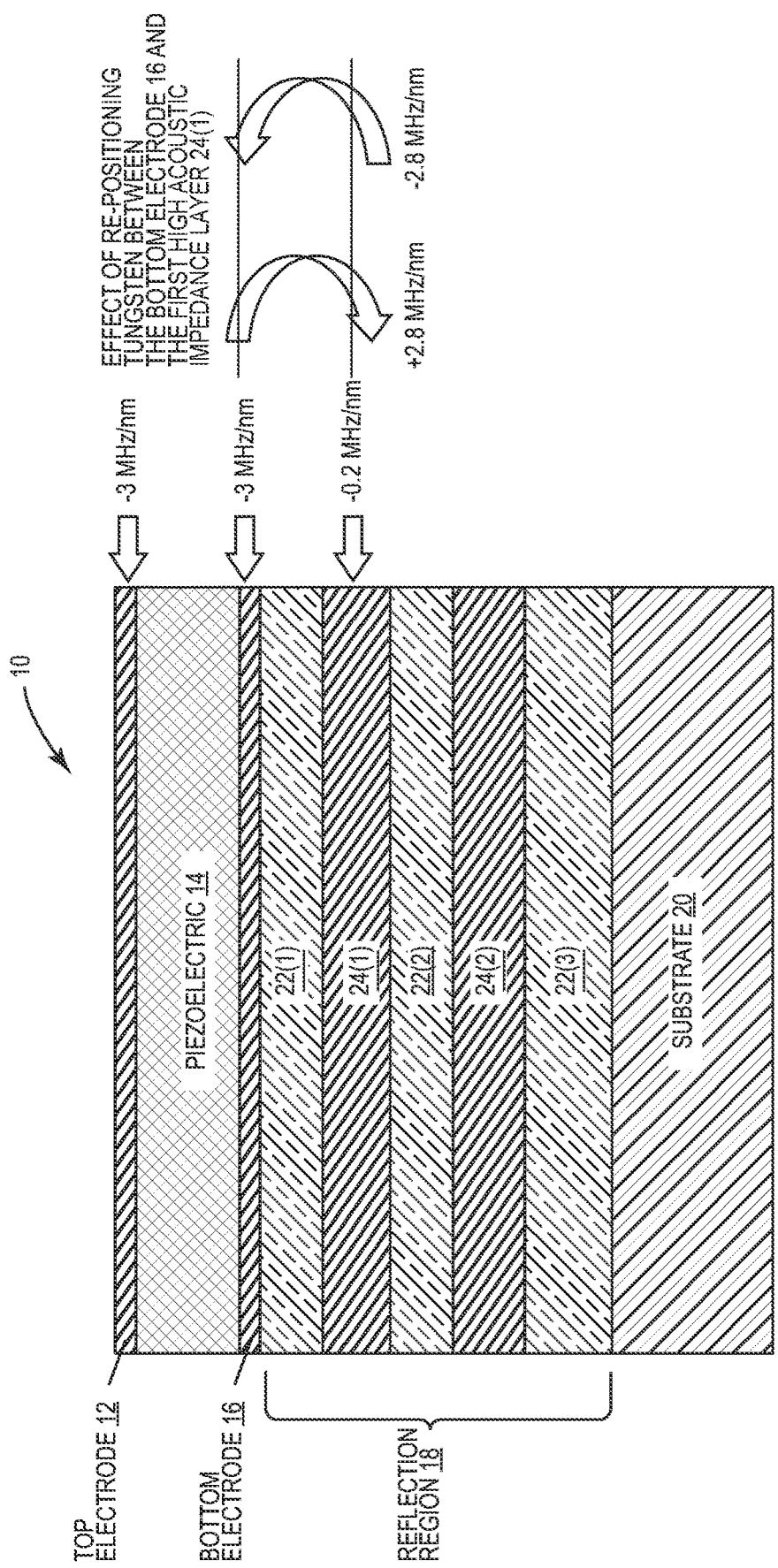
FIG. 1 shows a layer stack of a typical Bulk Acoustic Wave (BAW) resonator.
Figure 2:
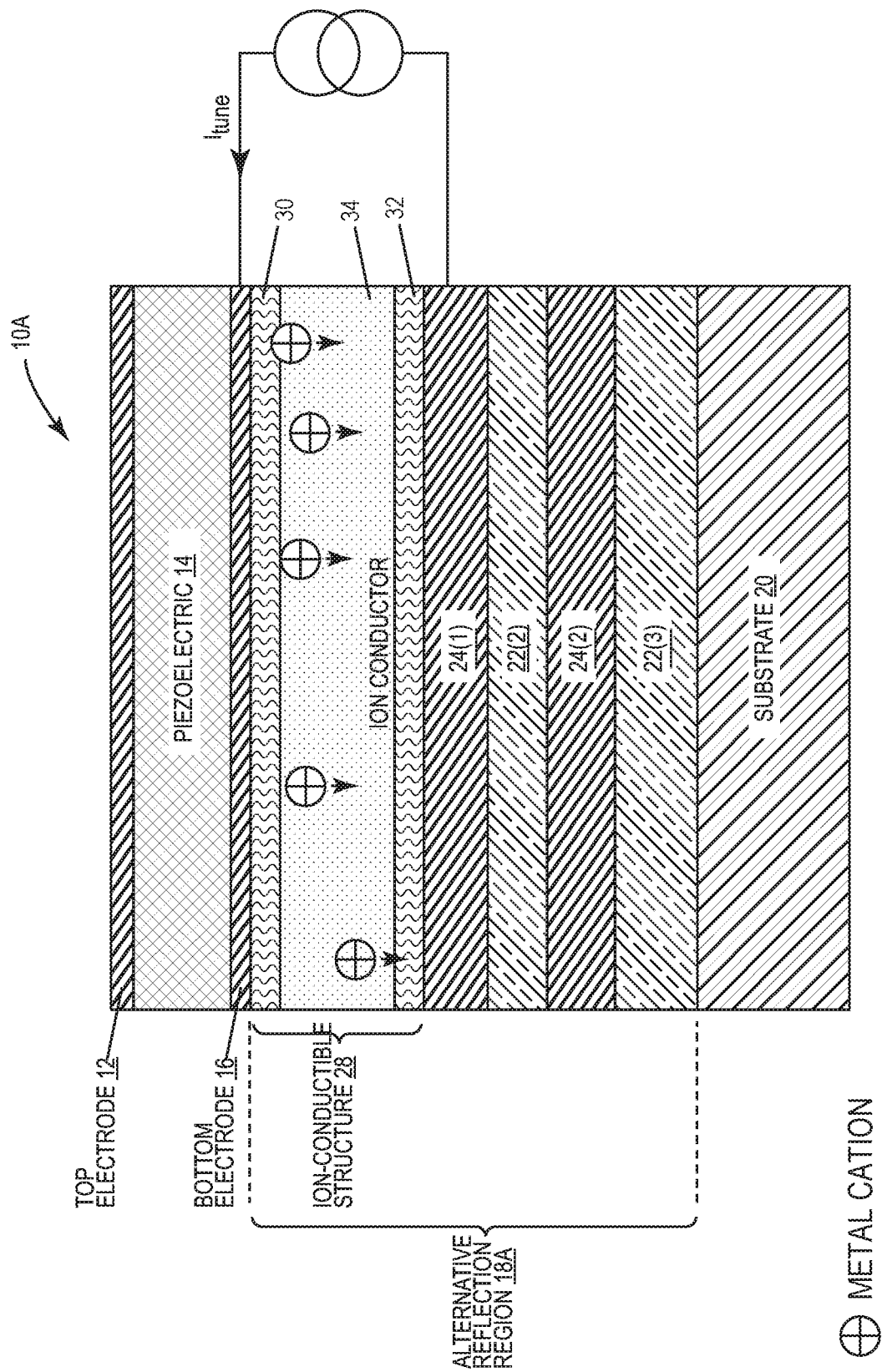
FIG. 2 shows an exemplary layer stack of a tunable BAW resonator with ion-conductible structure according to one embodiment of the present disclosure.
Figure 3:
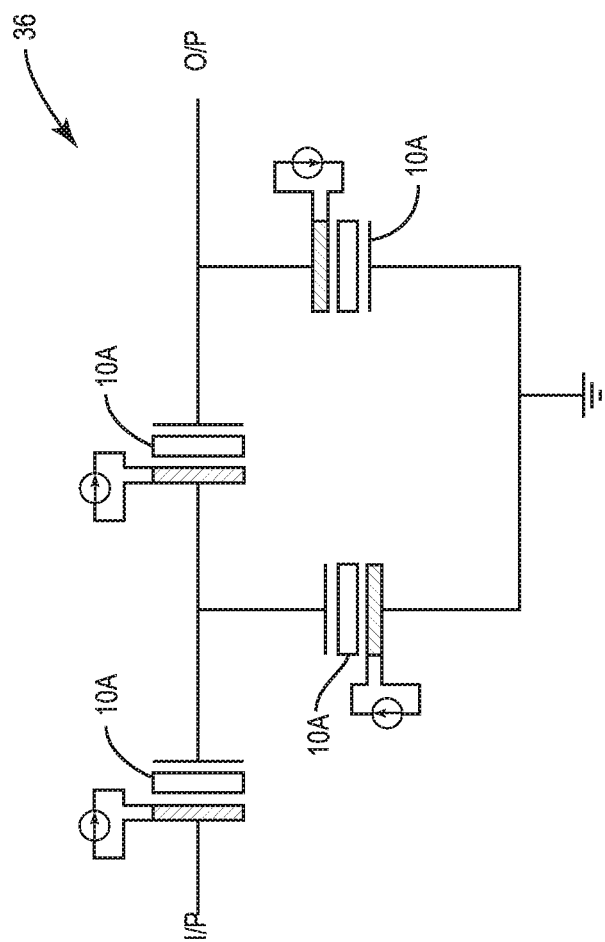
FIG. 3 shows a tunable BAW filter utilizing the tunable BAW resonator shown in FIG. 2.

It will be understood that for clear illustrations, FIGS. 1-3 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Due to their high Q values, and low insertion losses at microwave frequencies, Bulk Acoustic Wave (BAW) resonators have been widely used in Radio Frequency (RF) filter applications. In order to change the passband and stopband of the BAW filter, switch circuitry is commonly used to selectively switch the BAW resonators into or out of the BAW filter. Herein, each BAW resonator itself is not tunable in a frequency domain. FIG. 1 shows a layer stack of a typical BAW resonator 10.

In detail, the BAW resonator 10 includes a top electrode 12, a piezoelectric layer 14, a bottom electrode 16, a reflection region 18 with multiple alternating reflection layers with different acoustic impedance, and a substrate 20. The piezoelectric layer 14 is sandwiched between the top electrode 12 and the bottom electrode 16. The reflection region 18 resides underneath the bottom electrode 16 and resides over the substrate 20. By applying electrical signals to the top electrode 12 and the bottom electrode 16, acoustic waves are excited in the piezoelectric layer 14. The reflection region 18 is configured to minimize leakages of the acoustic waves from the piezoelectric layer 14.

The top electrode 12 and the bottom electrode 16 may be formed of tungsten (W), molybdenum (Mo), or platinum (Pt). The piezoelectric layer 14 may be formed of aluminum nitride (AlN) or zinc oxide (ZnO). The substrate 20 may be formed of silicon (Si). In one embodiment, the multiple alternating reflection layers within the reflection region 18 may include low acoustic impedance layers 22 and high acoustic impedance layers 24, which have higher acoustic impedance, higher density, and higher stiffness than the low acoustic impedance layers 22. The low acoustic impedance layers 22 may be formed of silicon dioxide ($SiO_2$), and the high acoustic impedance layers 24 may be formed of W. The bigger the differences in density and stiffness between adjacent low and high acoustic impedance layers 22 and 24, the better the reflection behavior of the reflection region 18.

For the purpose of this illustration, the reflection region 18 includes a first low acoustic impedance layer 22(1) underneath the bottom electrode 16, a first high acoustic impedance layer 24(1) underneath the first low acoustic impedance layer 22(1), a second low acoustic impedance layer 22(2) underneath the first high acoustic impedance layer 24(1), a second high acoustic impedance layer 24(2) underneath the second low acoustic impedance layer 22(2), and a third low acoustic impedance layer 22(3) underneath the second high acoustic impedance layer 24(2). The substrate 20 is underneath the third low acoustic impedance layer 22(3). In different applications, the reflection region 18 may include fewer or more alternating low and high acoustic impedance layers.

The BAW resonator 10 has a fixed resonance frequency, at which resonance of acoustic waves in the piezoelectric layer 14 occurs. In general, the resonance frequency of the BAW resonator 10 is defined by thicknesses, locations, and material parameters of the piezoelectric layer 14, the top and bottom electrodes 12 and 16, and the low and high acoustic impedance layers 22 and 24 within the reflection region 18.

The top electrode 12, the piezoelectric layer 14, and the bottom electrode 16 typically show the largest frequency sensitivity for changes in thickness and/or mass-loading, and thus have the biggest impact on the resonance frequency of the BAW resonator 10. The frequency sensitivity of a layer depends strongly on its position relative to the piezoelectric layer 14, and decreases exponentially away from the piezoelectric layer 14. Therefore, the low acoustic impedance layers 22 and the high acoustic impedance layers 24 within the reflection region 18 have much less impact on the resonance frequency of the BAW resonator 10 than the top and bottom electrodes 12 and 16. In addition, the first low acoustic impedance layer 22(1) has a bigger impact on the resonance frequency of the BAW resonator 10 than the rest of the low acoustic impedance layers 22(2) and 22(3). The first high acoustic impedance layer 24(1) has a bigger impact on the resonance frequency of the BAW resonator 10 than the second high acoustic impedance layer 24(2).

In a non-limited example, the top electrode 12, the bottom electrode 16, and the high acoustic impedance layers 24 are formed of W with the same material properties, the piezoelectric layer 14 is formed of AlN, the low acoustic impedance layers 22 are formed of $SiO_2$, and the BAW resonator 10 has a fixed resonance frequency at 2550 MHz. The top electrode 12 and the bottom electrode 16 have a frequency sensitivity of about −3 MHz/nm, the first low acoustic impedance layer 22(1) has a frequency sensitivity of about −1 MHz/nm, and the first high acoustic impedance layer 24(1) has a frequency sensitivity of about −0.2 MHz/nm. Frequency sensitivity of layers underneath the first high acoustic impedance layer 24(1) may be low enough to be neglected. Herein, the sign of the frequency sensitivity is negative, because thicker layers decrease resonance frequency.

As described above, even when formed of the same material W, there is still a big difference in the frequency sensitivity between the bottom electrode 16 and the first high acoustic impedance layer 24(1). Decreasing 1 nm of the thickness of the first high acoustic impedance layer 24(1) will not compensate the frequency change by increasing 1 nm of the thickness of the bottom electrode 16. More specifically, decreasing 1 nm of the thickness of the first high acoustic impedance layer 24(1) and increasing 1 nm of the thickness of the bottom electrode 16 will lead to 2.8 MHz decrease in the resonance frequency of the BAW resonator 10. Similarly, increasing 1 nm of the thickness of the first high acoustic impedance layer 24(1) and decreasing 1 nm of the thickness of the bottom electrode 16 will lead to 2.8 MHz increase in the resonance frequency of the BAW resonator 10. Notice that with a same total amount of W material in the bottom electrode 16 and the first high acoustic impedance layer 24(1), re-positioning the W material between the bottom electrode 16 and the first high acoustic impedance layer 24(1) may achieve the purpose of frequency tuning. However, there is no practical way to change the thickness of each layer of the BAW resonator 10, including the bottom electrode 16 and the thickness of the first high acoustic impedance layer 24(1), once the BAW resonator 10 is manufactured.

FIG. 2 shows an exemplary layer stack of a tunable BAW resonator 10A according to one embodiment of the present disclosure. Compared to the BAW resonator 10, the tunable BAW resonator 10A includes an alternative reflection region 18A instead of the typical reflection region 18 between the bottom electrode 16 and the substrate 20. In the alternative reflection region 18A, besides the first high acoustic impedance layer 24(1), the second low acoustic impedance layer 22(2), the second high acoustic impedance layer 24(2), and the third low acoustic impedance layer 22(3), there is an ion-conductible structure 28 instead of the first low acoustic impedance layer 22(1). In different applications, the alternative reflection region 18A may include fewer or more alternating low and high acoustic impedance layers below the ion-conductible structure 28. Note that the ion-conductible structure 28 is always between the bottom electrode 16 and a high acoustic impedance layer (in this embodiment, the first high acoustic impedance layer 24(1)).

The ion-conductible structure 28 includes a first terminal layer 30 physically and electrically coupled to the bottom electrode 16, a second terminal layer 32 physically and electrically coupled to the first high acoustic impedance layer 24(1), and an ion conductor 34 between the first terminal layer 30 and the second terminal layer 32. The first terminal layer 30 has higher frequency sensitivity than the second terminal layer 32 due to its closer position to the piezoelectric layer 14. Herein, the ion conductor 34 is eligible to transport ions between the first terminal layer 30 and the second terminal layer 32, so as to achieve a mass-loading shift between the first terminal layer 30 and the second terminal layer 32 (changing the thickness of the first terminal layer 30 and the thickness of the second terminal layer 32, while maintaining the total thickness of both the first terminal layer 30 and the second terminal layer 32) and consequently, to tune a resonance frequency of the tunable BAW resonator 10A.

The ion conductor 34 is required to be formed of an ion conductible material, which refers to a material that is eligible to allow ions (metal cations) to pass through. On the other hand, the ion conductor 34 is required to be formed of a low density material, which refers to a material having a density at most one fifth of a density of the first high acoustic impedance layer 24(1). As such, an acoustic impedance of the ion conductor 34 would be low enough compared to the first high acoustic impedance layer 24(1) to achieve high reflectivity at the interface of difference acoustic impedances. In a non-limiting example, the ion conductor 34 may be formed of one or more of lithium phosphorus oxynitride (LiPON), lithium lanthanum zinc oxide (LLZO), lithium lanthanum titanium oxide (LLTO), and the like, each of which is eligible to transport lithium (Li) ions and other metal ions. In addition, LiPON, LLZO, and LLTO have a range of mass densities between 2000 to 2300 kg/m$^3$, which is close to the mass density of SiO$_2$ and far below the mass density of W. Therefore, the big differences of the mass density between the ion conductor 34 and the first high acoustic impedance layer 24(1) should still provide high reflectivity. Accordingly, the tunable BAW resonator 10A, which replaces the first low acoustic impedance layer 22(1) formed of SiO$_2$ with the ion-conductible structure 28 including the ion conductor 34, can still work well from an acoustical point of view. A thickness of the ion conductor 34 depends on the forming material and depends on a tuning range of the resonance frequency of the tunable BAW resonator 10A.

In this embodiment, metal cations are driven between the first terminal layer 30 and the second terminal layer 32 through the ion conductor 34 by applying an electric current $I_{tune}$ from an outside power supply. One of the first terminal layer 30 and the second terminal layer 32 is an ion source (cathode), while another one is configured to store or release the ions (anode) during charging or discharging, respectively. The outside power supply may be a direct current (DC) voltage source or a DC current source, coupled to the bottom electrode 16 and the first high acoustic impedance layer 24(1). The electric current $I_{tune}$ flows either from the first terminal layer 30 (coupled to the bottom electrode 16) to the second terminal layer 32 (coupled to the first high acoustic impedance layer 24(1)) or from the second terminal layer 32 to the first terminal layer 30. The direction of the electric current $I_{tune}$ determines if the metal cations accumulate at the first terminal layer 30 or the second terminal layer 32. Accordingly, the mass-loading shifts from the first terminal layer 30 and the second terminal layer 32 or vice versa, so as to change the equivalent thickness of the first terminal layer 30 and the equivalent thickness of the second terminal layer 32. Since the first terminal layer 30 and the second terminal layer 32 have different frequency sensitivity, the metal cations accumulation at the first terminal layer 30 or at the second terminal layer 32 will lead to different resonance frequencies of the tunable BAW resonator 10A. If no outside current is applied, the metal-cations remain stationary and do not move through the ion conductor 34. Therefore, the electric current $I_{tune}$ is applied to the tunable BAW resonator 10A until the desired metal cation shift/mass-loading shift is achieved. Then, the electric current $I_{tune}$ is disconnected to keep the current metal cation position, so as to keep the current resonance frequency.

In this embodiment, with the sign of the electric current $I_{tune}$ shown in FIG. 2, the first terminal layer 30 (coupled to the bottom electrode 16) is the cathode, and the second terminal layer 32 (coupled to the first high acoustic impedance layer 24(1)) is the anode. During a charging process, the metal cations are transported from the first terminal layer 30 to accumulate at the second terminal layer 32, and the resonance frequency of the tunable BAW resonator 10A increases. During a discharging process, the metal cations are released from the second terminal layer 32 back to the first terminal layer 30, and the resonance frequency of the tunable BAW resonator 10A decreases.

In general, the anode is more prone to form clusters of metal than the cathode. Therefore the configuration with the cathode near the bottom-electrode 16 is more advantageous. Roughness from clusters on the anode away from the bottom-electrode 16 (away from the piezoelectric layer 14) will have less of an impact on acoustic losses (as it is in a region with lower energy density) in this case. An opposite configuration that the first terminal layer 30 (next to the bottom electrode 16) is the anode, and the second terminal layer 32 (next to the first high acoustic impedance layer 24(1)) is the cathode will also work if desired for other applications.

In a non-limiting example, materials for the cathode, in this case the first terminal layer 30, may be one or more of lithium cobalt oxide (LiCoO$_2$), lithium ion manganese oxide (LiMn$_2$O$_4$), vanadium pentoxid (V$_2$O$_5$), and the like. Materials for the anode, in this case the second terminal layer 32, may be Li or carbon. The ion conductor 34 (formed of one or more of LiPON, LLZO and LLTO) is eligible to transport Li or V ions between the first terminal layer 30 and the second terminal layer 32. Notice that the materials used for the ion conductor 34 must has a significantly lower mass density than at least one of the first terminal layer 30 and the second terminal layer 32 (in this case, the density of the first terminal layer 30 is 5 or more times greater than the density of the ion conductor 34). Otherwise the repositioning of the metal cations between the first terminal layer 30 and the second terminal layer 32 may not change the resonance frequency of the tunable BAW resonator 10A.

Depending on different desired tuning ranges (+/–10% resonance frequency, or +/–5% resonance frequency) and/or depending on different forming materials, the first terminal layer 30 and the second terminal layer 32 may have different thicknesses. Ideally, both the first terminal layer 30 and the second terminal layer 32 can be considered acoustically thin (referring to less than 5% of an acoustic wavelength in the piezoelectric layer 14) and therefore do not modify the acoustic behavior of the tunable BAW resonator 10A significantly. The first terminal layer 30, the ion conductor 34, and the second terminal layer 32 are desired to be applied by compatible methods with a manufacturing flow for the typical BAW resonator 10, such as reactive RF-sputtering.

In another embodiment, for relatively large tuning ranges, the ion conductor 34 is desired to be eligible for transporting heavier ions, like silver ions, since the tuning effect would be larger per cation transported. The ion conductor 34 may be formed of silver-iodide, the first terminal layer 30 and the second terminal layer 32 may be formed of metal alloy containing silver, such as silver copper (AgCu).

FIG. 3 shows a tunable BAW filter 36 with a ladder configuration utilizing multiple tunable BAW resonators 10A. Each tunable BAW resonator 10A may have its own DC power supply for frequency tuning. Herein, the tunable BAW filter changes the passband and stopband by tuning the resonance frequency of each tunable BAW resonator 10A, without switching any tunable BAW resonator 10A into or out of the ladder configuration. In some cases, the tunable BAW filter may change the passband and stopband by tuning the resonance frequency of some tunable BAW resonators 10A (not each). All RF signals always take the same path (from an input port VP to an output port O/P) through the tunable BAW filter 36 without any switches, which may cause extra insertion losses.

Those skilled in the art will recognize improvements and modifications to the preferred embodiments of the present disclosure. All such improvements and modifications are considered within the scope of the concepts disclosed herein and the claims that follow.

What is claimed is:

1. A tunable Bulk Acoustic Wave (BAW) resonator comprising:
   a top electrode;
   a bottom electrode;
   a piezoelectric layer sandwiched between the top electrode and the bottom electrode; and a reflection region residing underneath the bottom electrode and comprising a reflection layer and an ion-conductible structure between the bottom electrode and the reflection layer, wherein:
- the ion-conductible structure includes a first terminal layer coupled to the bottom electrode, a second terminal layer coupled to the reflection layer, and an ion conductor between the first terminal layer and the second terminal layer;
- the ion conductor is capable of transporting ions between the first terminal layer and the second terminal layer, so as to achieve a mass-loading shift between the first terminal layer and the second terminal layer, and consequently, to tune a resonance frequency of the tunable BAW resonator; and
- the reflection layer has a greater density than a density of the ion conductor, and at least one of the first terminal layer and the second terminal layer has a greater density than the density of the ion conductor.

2. The tunable BAW resonator of claim 1 wherein the ions are transported through the ion conductor between the first terminal layer and the second terminal layer by applying an electric current from an outside power supply.

3. The tunable BAW resonator of claim 2 wherein a direction of the electric current determines if the ions accumulate at the first terminal layer or accumulate at the second terminal layer.

4. The tunable BAW resonator of claim 1 wherein the first terminal layer has a greater frequency sensitivity than the second terminal layer, such that the first terminal has a greater frequency effect on the resonance frequency of the tunable BAW resonator than the second terminal with a same thickness change.

5. The tunable BAW resonator of claim 1 wherein the density of the reflection layer is 5 or more times greater than the density of the ion conductor.

6. The tunable BAW resonator of claim 1 wherein the density of at least one of the first terminal layer and the second terminal layer is 5 or more times greater than the density of the ion conductor.

7. The tunable BAW resonator of claim 1 wherein the reflection region includes alternating high acoustic impedance layers and low acoustic impedance layers underneath the ion-conductible structure, wherein:
- the high acoustic impedance layers have higher acoustic impedance, higher density, and higher stiffness than the low acoustic impedance layers; and
- the reflection layer is one of the high acoustic impedance layers, and resides at a top of the alternating high acoustic impedance layers and low acoustic impedance layers.

8. The tunable BAW resonator of claim 7 wherein:
each of the high acoustic impedance layers is formed of tungsten; and
each of the low acoustic impedance layers is formed of silicon dioxide ($SiO_2$).

9. The tunable BAW resonator of claim 1 wherein:
a thickness of the first terminal layer is less than 5% of an acoustic wavelength in the piezoelectric layer; and
a thickness of the second terminal layer is less than 5% of the acoustic wavelength in the piezoelectric layer.

10. The tunable BAW resonator of claim 1 wherein:
the first terminal layer is a cathode, which is an ion source; and
the second terminal layer is an anode, which is configured to store or release the ions.

11. The tunable BAW resonator of claim 10 wherein:
the ions are transported through the ion conductor between the first terminal layer and the second terminal layer by applying an electric current from an outside power supply;
during a charging process, the ions are transported from the first terminal layer to accumulate at the second terminal layer, so as to increase the resonance frequency of the tunable BAW resonator; and
during a discharging process, the ions are released from the second terminal layer back to the first terminal layer, so as to decrease the resonance frequency of the tunable BAW resonator.

12. The tunable BAW resonator of claim 10 wherein the density of the first terminal layer is 5 or more times greater than the density of the ion conductor.

13. The tunable BAW resonator of claim 10 wherein:
the ion conductor is formed of one or more of a group consisting of lithium phosphorus oxynitride (LiPON), lithium lanthanum zinc oxide (LLZO), and lithium lanthanum titanium oxide (LLTO);
the first terminal layer is formed of one or more of a group consisting of lithium cobalt oxide ($LiCoO_2$), lithium ion manganese oxide ($LiMn_2O_4$), and vanadium pentoxid ($V_2O_5$); and
the second terminal layer is formed of lithium or carbon.

14. The tunable BAW resonator of claim 1 wherein:
the second terminal layer is a cathode, which is an ion source; and
the first terminal layer is an anode, which is configured to store or release the ions.

15. The tunable BAW resonator of claim 1 wherein the ion conductor is formed of silver-iodide.

16. The tunable BAW resonator of claim 1 wherein:
the top electrode and the bottom electrode are formed of one of a group consisting of tungsten (W), molybdenum (Mo), and platinum (Pt); and
the piezoelectric layer is formed of aluminum nitride (AlN) or zinc oxide (ZnO).

17. The tunable BAW resonator of claim 1 further comprising a substrate formed of silicon (Si), wherein the reflection region is coupled between the bottom electrode and the substrate.

* * * * *